United States Patent [19]

Kimura et al.

[11] 4,423,498
[45] Dec. 27, 1983

[54] CONTROL APPARATUS FOR A RECORDING MEDIUM DRIVE MOTOR IN A DIGITAL INFORMATION REPRODUCING APPARATUS

[75] Inventors: Hiroyuki Kimura, Yokohama; Shin-ichi Ohashi, Chigasaki; Keizo Nishimura, Yokohama, all of Japan

[73] Assignee: Hitachi, Ltd., Tokyo, Japan

[21] Appl. No.: 311,048

[22] Filed: Oct. 13, 1981

[30] Foreign Application Priority Data

Oct. 13, 1980 [JP] Japan ................................ 55-142088
Oct. 13, 1980 [JP] Japan ................................ 55-142094

[51] Int. Cl.³ .............................................. G11B 19/24
[52] U.S. Cl. ..................................... 369/47; 307/234; 318/312; 358/322; 358/338; 360/74.4; 369/50; 369/59; 369/189; 369/240
[58] Field of Search ................... 369/47, 50, 59, 115, 369/189, 239, 240; 360/74.4, 73; 375/106, 109, 116, 118; 318/310, 311, 312; 358/321, 322, 338, 339; 307/234

[56] References Cited

U.S. PATENT DOCUMENTS

| 2,334,510 | 11/1943 | Roberts | 369/47 |
| 3,646,259 | 2/1972 | Schuller | 369/47 X |
| 3,980,960 | 9/1976 | Hutchinson | 307/234 X |
| 4,086,538 | 4/1978 | Foreman | 307/234 X |
| 4,190,860 | 2/1980 | Somers et al. | 369/240 |
| 4,223,349 | 9/1980 | Dakin et al. | 358/342 X |
| 4,348,699 | 9/1982 | Tsuchiya et al. | 360/73 X |

Primary Examiner—Robert L. Richardson
Attorney, Agent, or Firm—Antonelli, Terry & Wands

[57] ABSTRACT

A digital audio disc (DAD) reproducing apparatus comprises pulse width detection and pulse width-to-voltage conversion means for detecting a signal having a predetermined pulse width such as a maximum or minimum pulse width of code modulated digital data signals reproduced by a pickup and converting the detected signal to a voltage proportional to the pulse width, and pulse width error detection means for detecting an error between the converted voltage and a reference voltage corresponding to a reference pulse width. Since the pulse width of the digital data signal changes with a clock rate, the error from the reference voltage represents an error in the clock rate.

12 Claims, 25 Drawing Figures

CONTROL APPARATUS FOR A RECORDING MEDIUM DRIVE MOTOR IN A DIGITAL INFORMATION REPRODUCING APPARATUS

BACKGROUND OF THE INVENTION

The present invention relates to an apparatus for controlling a rotation speed of a drive motor for a digital record reproducing apparatus.

In a digital signal recording and reproducing apparatus, a digital signal is frequently reproduced at a fixed clock rate. One example thereof is a digital disc reproducing apparatus.

In the disc reproducing apparatus in which a digital signal is reproduced by a pickup, a rotation speed of a disc drive motor is generally controlled in the following manners. One method is a constant angular velocity (CAV) system in which the rotation speed of the disc is maintained constant over an entire reproduction range. Another method is a constant linear velocity (CLV) system in which a relative velocity between the disc and the pickup is maintained constant.

In the CAV system, an information density in a unit track length is lower in an outer periphery than in an inner periphery, while in the CLV system it is constant over the entire range. Accordingly, the CLV system is more adapted to high density recording.

In the CLV system, however, it is necessary to increase the rotation speed of the disc drive motor as the pickup goes toward the inner periphery so that the relative speed between the disc and the pickup, that is, a linear speed is kept constant and the clock rate of the reproduced digital signal is kept constant.

A known control circuit for the CLV system is shown in FIG. 1, in which numeral 1 denotes a motor, numeral 2 denotes a disc on which a digital signal has been recorded, numeral 3 denotes a power supply, numeral 4 denotes a potentiometer, numeral 5 denotes a pickup such as a laser sensor, numeral 6 denotes a motor drive circuit and numeral 7 denotes a starting power supply.

The operation of the control circuit of FIG. 1 is explained below. When the starting voltage from the power supply 7 is applied to the drive circuit 6, the motor 1 starts to rotate up to a rotation speed determined by the starting voltage from the power supply 7. As the pickup 5 traces the disc 2 and goes toward the inner periphery, a division ratio of the potentiometer coupled to the pickup 5 varies. A voltage divided by the potentiometer 4 is added to the starting voltage from the power supply 7 in an adder and a sum voltage is supplied to the drive circuit 6. As a result, as the pickup 5 moves toward the inner periphery, the voltage supplied to the drive circuit 6 increases to increase the rotation speed of the motor so that the relative velocity between the disc 2 and the pickup 5, that is, the clock rate of the signal is kept constant. See, for example, Japanese Patent Application Laid-Open No. 54-12816.

In the prior art system described above, a high accuracy of operation is not attained because the position of the pickup 5 is detected by the potentiometer 4. In addition, if the initial setting is wrong, a correct rotation speed is not attained and hence a constant clock rate of the signal is not attained.

SUMMARY OF THE INVENTION

It is an object of the present invention to provide a clock rate detector which correctly discriminates the clock rate of the reproduced digital signal.

It is another object of the present invention to provide a circuit for controlling a rotation speed of a drive motor of a disc reproducing apparatus or digital record tape reproducing apparatus, which circuit can be CLV-controlled with a high accuracy and operated in a stable manner when phase-control is simultaneously used.

In accordance with the present invention, in a disc reproducing apparatus such as a digital audio disc (DAD) apparatus, a signal having a predetermined pulse width such as a maximum pulse width or a minimum pulse width is detected from a digital data signal reproduced from the disc by the pickup, and the pulse width of the detected signal is converted to a corresponding voltage, which in turn is compared with a reference voltage corresponding to a predetermined normal pulse width in order to detect an error. Since the pulse width of the digital data signal changes with the clock rate, the error relative to the reference voltage is detected as an offset of the clock rate. The clock rate detector of the present invention is applicable to the disc reproducing apparatus of either the CAV system or the CLV system, independently of the control system for the rotation speed of the disc. The present clock rate detector is also applicable to the digital record tape reproducing apparatus or magnetic disc memory unit.

In accordance with one aspect of the present invention, in a servo system of the digital data reproducing apparatus, the rotation speed of the motor can be exactly set to a target speed, and once a loop has been closed, a synchronization is kept between a clock generator and a code modulated digital data such as a modified frequency modulation (MFM) signal, and the clock rate of the reproduced MFM signal is discriminated at an accuracy of the clock generator. In the MFM system, pulse sequences 111 and 000 are inverted for every cycles where T is a clock period, pulse sequences 100 and 001 are inverted for every 1.5T cycles and a pulse sequence 101 is inverted for every 2T cycles.

In code modulation data other than the MFM signal, the clock rate of the signal can be detected by the same circuit configuration in the disc recorded by a record modulation system such as eight-to-fourteen modulation (EFM), zero modulation (ZM) or three-position modulation (3PM) in which a distance between signal transitions is one of a plurality of fixed values such as 1.0T, 1.5T and 2.0T in the MFM signal, and the drive motor speed can be controlled by the error voltage between the clock rate detected and the reference voltage.

In accordance with the present invention, since the rotation speed of the motor is controlled to maintain the clock rate of the signal reproduced by the pickup at a constant rate, the circuit configuration allows the reproduction of the signal either in the CAV system or in the CLV system.

Furthermore, the signal of the constant clock rate can be reproduced from the disc or the tape without detecting the position of the pickup.

DESCRIPTION OF THE PREFERRED EMBODIMENTS

In the accompanying drawings, like numerals denote like elements and parts throughout.

Figure 1:
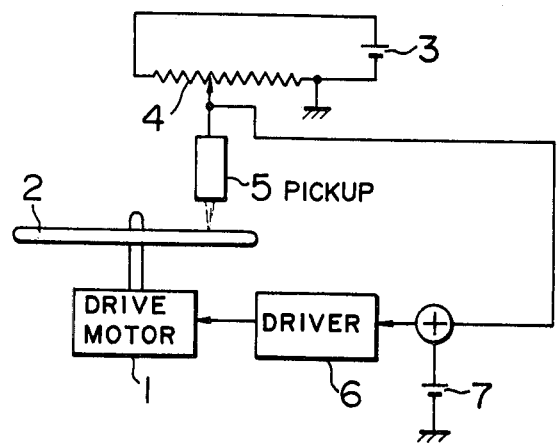
FIG. 1 shows a prior art circuit diagram.
Figure 3:
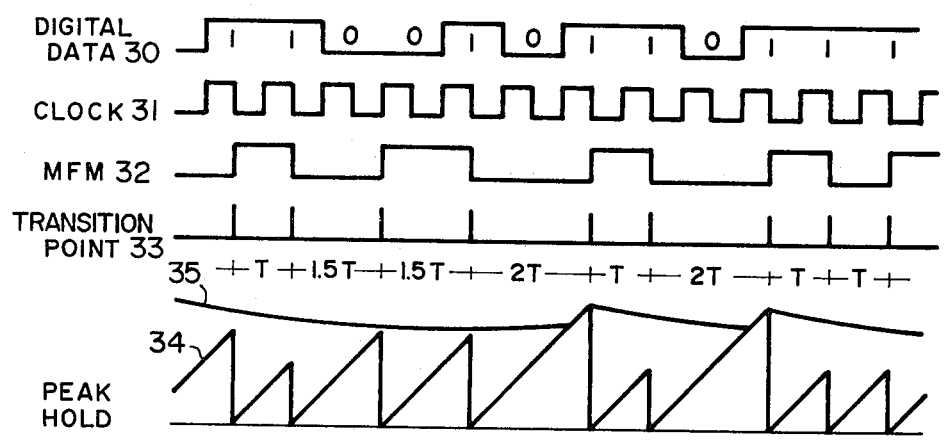
FIG. 3 shows a time chart.
Figure 2:
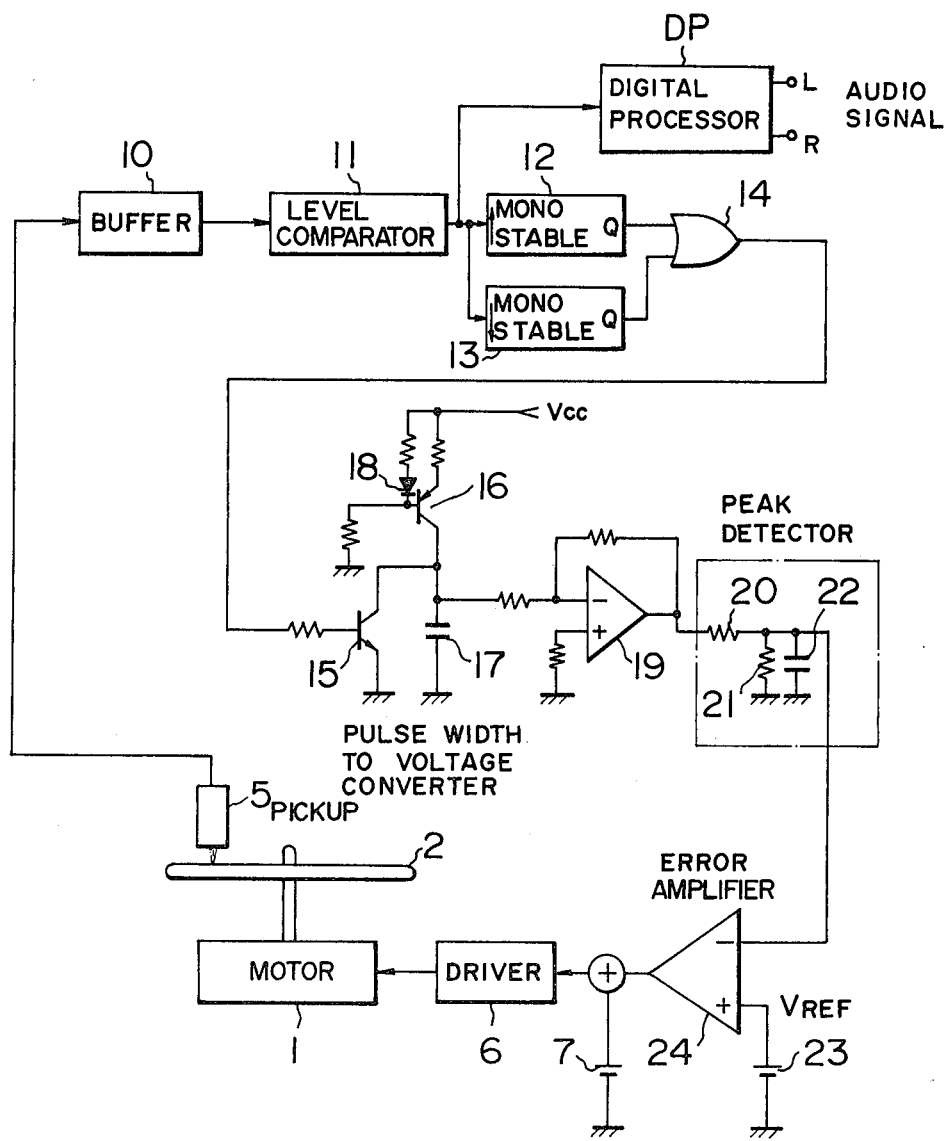
FIG. 2 shows a circuit diagram for primarily illustrating a principle of the present invention.

FIG. 2 shows an embodiment of the present invention applied to a DAD reproducing apparatus, and FIG. 3 shows a time chart therefor. Numerals 10 and 19 denote buffer amplifiers, 11 denotes a level comparator for waveform-shaping a picked-up signal, DP denotes a digital processor which processes digital signals to reproduce L and R audio signals, 12 and 13 denote monostable multivibrators, 14 denotes an OR gate, 15 and 16 denote transistors, 17 and 22 denote capacitors, 18 denotes a diode, 20 and 21 denote resistors, 23 denotes a reference voltage source, and 24 denotes an error amplifier. In FIG. 3, numeral 30 denotes a digital data signal indicative of an audio signal to be recorded on the disc, 31 denotes a clock signal, 32 denotes an MFM signal of the digital data signal 30 recorded on the disc, 33 denotes pulse signal transition points, 34 denotes a sawtooth wave and 35 denotes a peak detection waveform.

The digital data signal 30 is recorded on the disc in the MFM form. In the MFM recorded signal, synchronizing signals are inserted one for every predetermined interval (one frame or one horizontal scan period). Regarding the clock period T, synchronizing signals are inserted one for every 128T interval for the MFM system and 588T interval (T=approximately 200 nanoseconds) for the EFM system. In the MFM system, if "1's" continuously appear in the digital data signal 30, the recording signal is inverted at the midpoint of each "1" bit, and if "0's" continuously appear, the recording signal is inverted at each boundary of "0" bits. The distance between signal transitions in the MFM system is T, 1.5T or 2T where T is the clock period. By controlling the rotation speed of the motor 1 such that the distance between the signal transitions in the reproduced signal is constant, the clock rate of the signal reproduced from the disc 2 is kept constant.

The operation of the circuit is described below. The code modulated digital data signal recorded on the disc is reproduced by the pickup 5, and it is amplified by the buffer amplifier 10, an output of which is supplied to the level comparator 11 which discriminates "1" or "0" of the signal to reshape the waveform in order to reproduce the MFM signal 32. The rise and the fall points of the MFM pulse signal are detected by the monostable multivibrators 12 and 13 and a logical OR function of the outputs is produced by the OR gate 14 in order to detect the signal transition points 33 of the MFM signal 32. After the transition points 33 have been detected, a constant current circuit including the transistor 16 and the diode 18, a discharge circuit including the transistor 15, and a sawtooth generator including the integrating capacitor 17 are actuated. Each time the transition point 33 is detected, the capacitor 17 is discharged so that the sawtooth wave 34 having a peak value which is proportional to the pulse width is generated. The sawtooth wave is amplified by the buffer amplifier 19, an output of which is supplied to a peak detector comprising the resistors 20 and 21 and the capacitor 22 to peak-hold highest peak value. Thus, a D.C. voltage which represents the widest pulse width 2T in the MFM signal 32 is detected.

A reference voltage source 23 produces a reference voltage $V_{REF}$ which is equal to the D.C. voltage produced by the peak detector when the disc 2 is rotating at the correct speed. An error between the output of the peak detector and the reference voltage $V_{REF}$ is amplified by the error amplifier 24, an output of which is added to the motor starting voltage 7 and a sum voltage is supplied to the motor drive circuit 6. If the rotation speed of the motor is low and hence the clock rate of the signal is low, the distance between the transition points in the MFM signal increases and the output of the error amplifier 24 is supplied to the motor drive circuit 6 to accelerate the motor 1.

Even when the maximum peak value 2T is not recorded on the disc in a certain synchronizing pulse period it is detected by the pickup, by setting the time constant of the peak detector to be longer than the interval between the synchronizing signals (the sync period) since at least one maximum peak value corresponding to the interval 2T is recorded on the disc during each sync period.

As described above, by converting the pulse width of the MFM signal to the voltage to detect the clock rate and supplying a voltage for correcting the error between the detected voltage and the reference voltage $V_{REF}$ to the motor through the motor drive circuit 6, the constant clock rate is attained.

Figure 4:
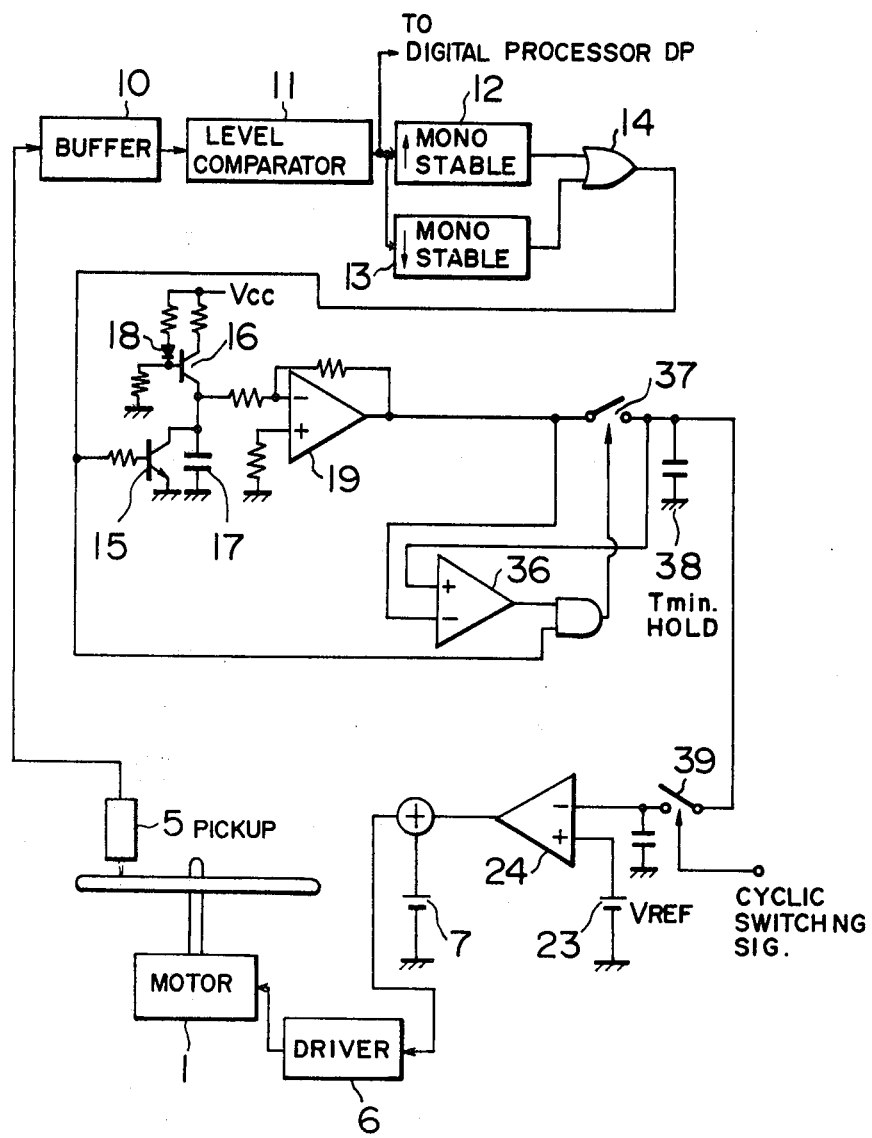
FIG. 4 shows a circuit diagram of one embodiment of the present invention.

FIG. 4 shows another embodiment of the present invention. Numeral 36 denotes a comparator, 37 and 39 denote switches and 38 denotes a holding capacitor. While the maximum pulse width 2T of the MFM signal was considered in the embodiment of FIG. 3, the minimum pulse width T is detected in the present embodiment. The MFM signal is converted by the transistors 15 and 16 and the capacitor 17 to the sawtooth wave having peak values proportional to the pulse widths. A voltage in the holding capacitor 38 and the sawtooth wave peak voltage are compared by the comparator 36, and if the sawtooth wave peak value is smaller, the switch 37 is closed at the signal transition point so that the sawtooth wave peak voltage is held. After a voltage proportional to the minimum pulse width of the MFM signal in a given interval has been held in the holding capacitor 38, it is supplied to one input of the error amplifier 24 through the switch 39 closed at a constant frequency which is greater than the synchronization frequency, for example.

As described above, by holding the voltage corresponding to the minimum pulse width, the servo control is effected to maintain the voltage constant. In this manner, the motor is controlled to maintain the clock rate of the signal constant.

Figure 5:
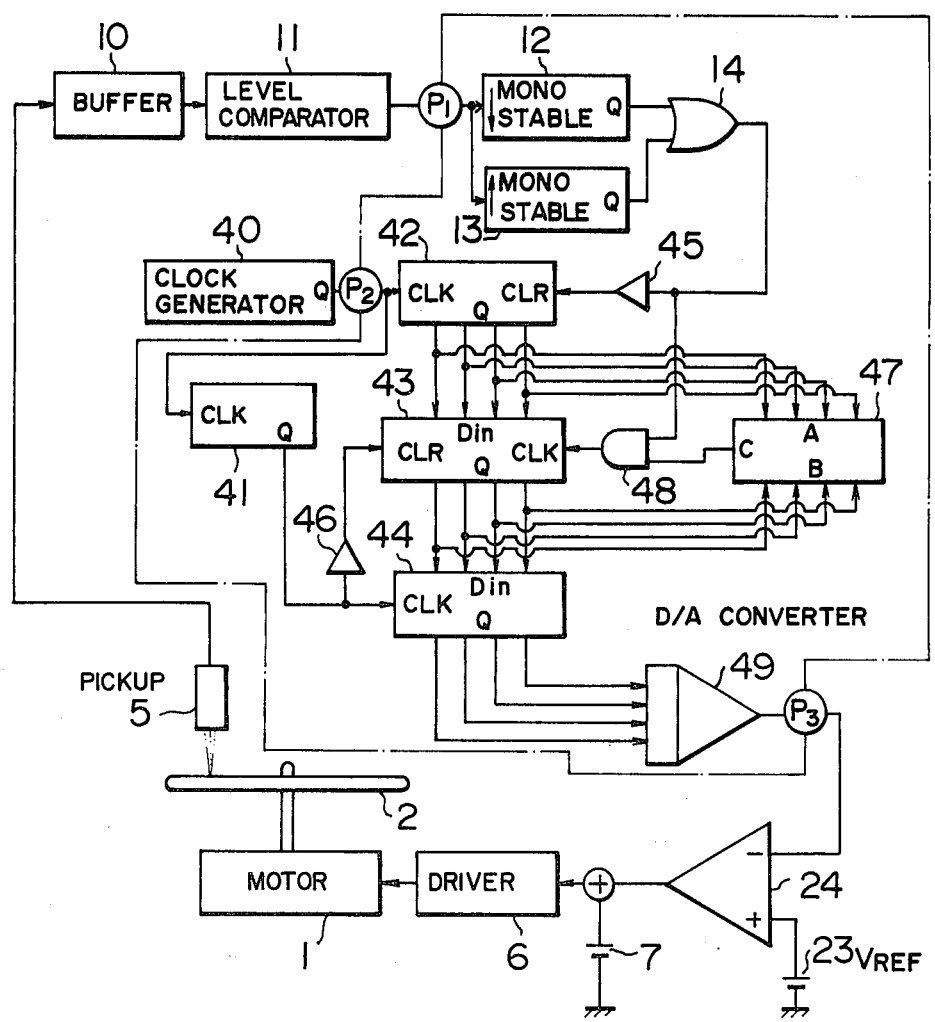
FIGS. 5 and 6 show a circuit diagram of a clock rate detector and a timing chart thereof in an embodiment of the present invention adapted to be implemented in a digital IC, respectively.

FIG. 5 shows an embodiment of the clock rate detector of the present invention adapted to be implemented in a digital IC. Numeral 40 denotes a clock generator, 41 and 42 denote a clock counter and a pulse width indication counter, respectively, 43 and 44 denote primary and secondary latches each including a D-type flip-flop, 45 and 46 denote buffers, and 47 denotes a digital comparator. The latch 44 holds the maximum content of the counter 42. Numeral 48 denotes an AND gate, 49 denotes a D/A converter which converts a digital signal to an analog signal, and $P_1$, $P_2$ and $P_3$ denote a data input pin, a clock input pin and a clock rate detection output pin, respectively. The circuit enclosed by a dot-and-dash line in FIG. 5 is adapted to be implemented by a one-chip IC. In the embodiment shown in FIG. 2, the distance between the signal transition points is converted to the sawtooth wave and the peak thereof is detected. In the present embodiment, the distance between the signal transition points is digitally measured to determine the clock rate of the signal, and the error from the reference voltage 23 is fed back to the motor drive circuit 6 to control the rotation speed of the motor such that the clock rate of the signal is properly maintained constant.

Figure 6:
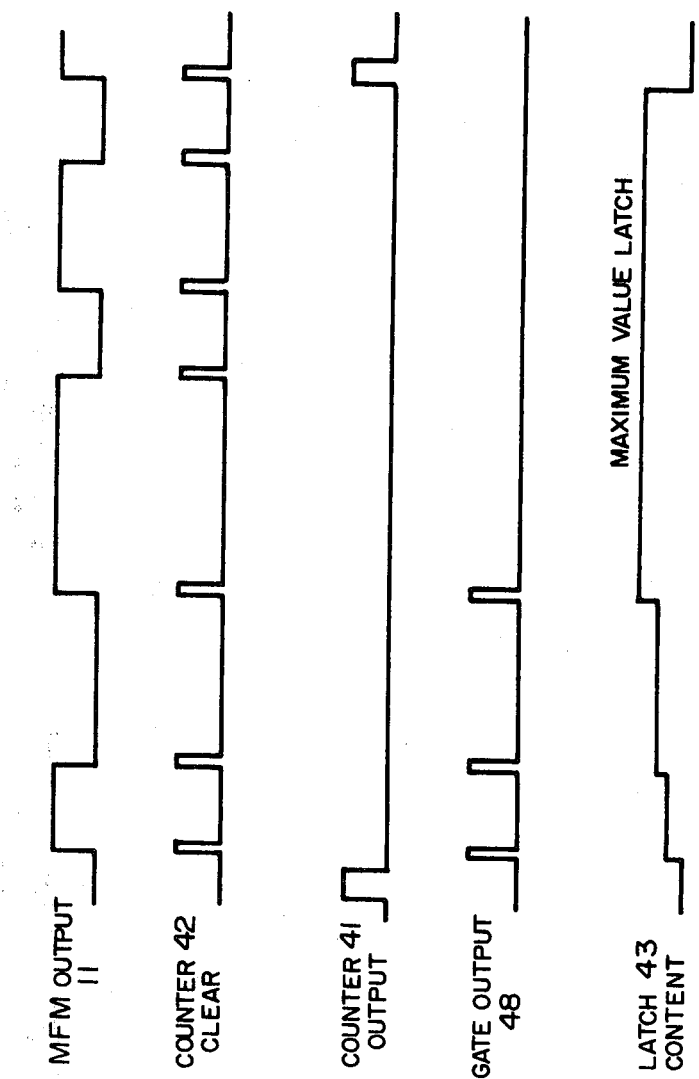

The operation of FIG. 5 is explained below with reference to a time chart shown in FIG. 6. The counter 42 is cleared by the output of the OR gate 14 at each signal transition. Since the counter 42 counts the clocks from the clock generator, it contains a count proportional to the distance between the signal transition points, before it is cleared. The digital comparator 47 compares the input and output values of the D-type flip-flop 43, and if the input value is larger it closes the AND gate 48 and loads the content of the counter 42 to the D-type flip-flop 43. Thus, the D-type flip-flop 43 stores the maximum number of clocks, that is, the number of clocks proportional to the pulse width 2T of the MFM signal. After the counter 41 has counted up a predetermined number of clocks from the clock generator 40, the content of the D-type flip-flop 43 is transferred to the D-type flip-flop 44, and the D-type flip-flop 43 is cleared. Thus, the largest count of the period counted by the counter 42 among the periods determined by the counter 41 is loaded to the D-type flip-flop latch 44.

Thus, the content of the D-type flip-flop 43 immediately before it is cleared is latched in the D-type flip-fop 44 so that the content of the D-type flip-flop 44 indicates the maximum value of edge-to-edge distance of the MFM signal within a period of carry output of the counter 41.

By selecting the period of the carry output of the counter 41 such that at least one pattern having the edge-to-edge distance of the MFM signal or the pulse width 2T is included in that period, that is, by inserting the synchronizing signal patterns in the MFM signal sequence at a constant time interval such as at least one 2T pattern is included within the synchronizing signal pattern and setting the period of the carry output of the counter 41 to be longer than the interval between the synchronizing signals, the content of the D-type flip-flop 44 always indicates the number of clocks of the clock generator 40 counted by the counter 42 within the 2T pattern which is the maximum edge-to-edge distance in the MFM signal. Accordingly, if the rotation speed of the motor 1 is low, the content of the D-type flip-flop 44 is large, and if the speed is high the content is small. Since the Q output of the D-type flip-flop 44 is proportional to the pulse width 2T in the MFM signal, it is converted to a voltage by the D/A converter 49 and applied to one input of the error amplifier to control the motor and maintain the clock rate of the signal constant in the same manner as described with reference to FIG. 2.

While the maximum pulse width 2T of the MFM signal is detected in the illustrated embodiment, the minimum pulse width T may be detected by comparing the input and output values of the D-type flip-flop by the digital comparator 47 and latching the input to the D-type flip-flop only when the input is smaller, and the minimum pulse width may be maintained constant.

Figure 7:
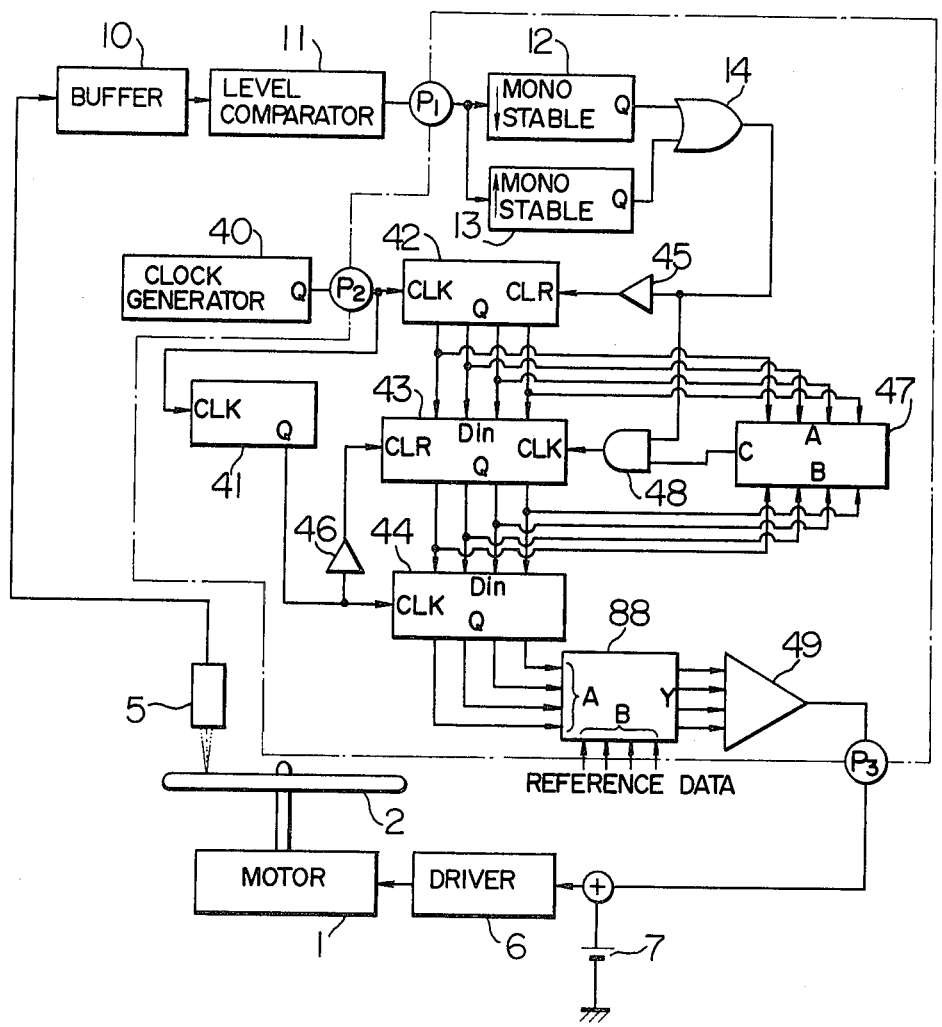
FIG. 7 shows a modification of the clock rate detector of FIG. 5.

FIG. 7 shows a preferred modification of the digital IC circuit of FIG. 5. In the present embodiment, simplification of the circuit is enhanced by further incorporating an error amplifier in the IC circuit of FIG. 5. In FIG. 7, numeral 88 denotes an error comparator formed of for example, a subtractor circuit, which is formed in a digital circuit. The error comparator 88 detects a difference between the maximum value of an MFM signal fetched by the latch circuit 44 and a reference value indicative of the maximum pulse width of the MFM signal in the normal rotation of the drive motor 1. The output of the error detector 88 indicates a deviation from the reference value in a digital form. The D/A converter 49 converts the digital deviation into a voltage proportional to the deviation to determine a motor control quantity to control the motor 1.

Figure 8:
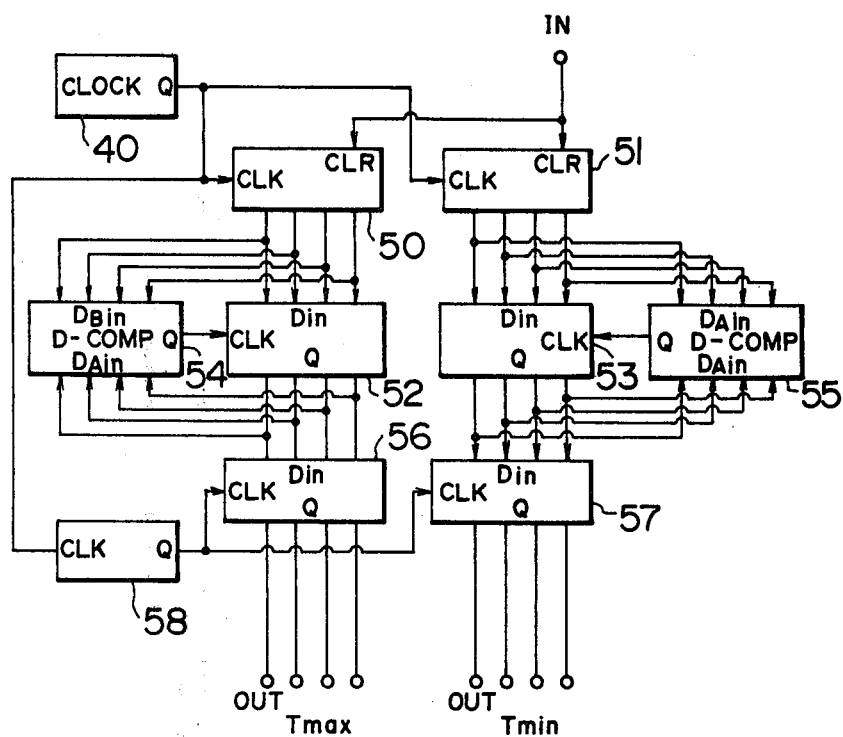
FIG. 8 shows a circuit diagram of another embodiment of the present invention.

FIG. 8 shows another embodiment of the present invention. Like numerals to those shown in FIG. 5 denote elements having like functions. Numerals 50, 51 and 58 denote counters, numerals 52, 53, 56 and 57 denote D-type flip-flops and numerals 54 and 55 denote digital comparators. In the embodiment shown in FIG. 5, the maximum or minimum pulse width of the MFM signal is detected. In that case, if there is an error in counting due to signal dropout or jitter, an input voltage supplied to the error amplifier will significantly change. In the present embodiment, in order to reduce the above affect, the maximum and minimum pulse widths are detected and the clock rate is determined based on those two widths.

The operation of the circuit of FIG. 8 is now described. The counters 50 and 51 receive the output of the OR gate 14 and are reset at each signal transition of the MFM signal to count the distance between the signal transition points. The maximum count of the counter 50 is compared by the digital comparator 54 at each signal transition and is latched by the D-type flip-flop 52 and the minimum count of the counter 51 is compared by the digital comparator 55 at each signal transition and is latched by the D-type flip-flop 53. The maximum and minimum pulse widths are latched to the D-type flip-flops 56 and 57, respectively, at a cycle determined by the counter 58. If one of the maximum and minimum value outputs of the latches 56 and 57 is in error by the distortion of the MFM signal, the other value is used to detect the clock rate so that the malfunction due to the disturbance is suppressed.

Figure 9:
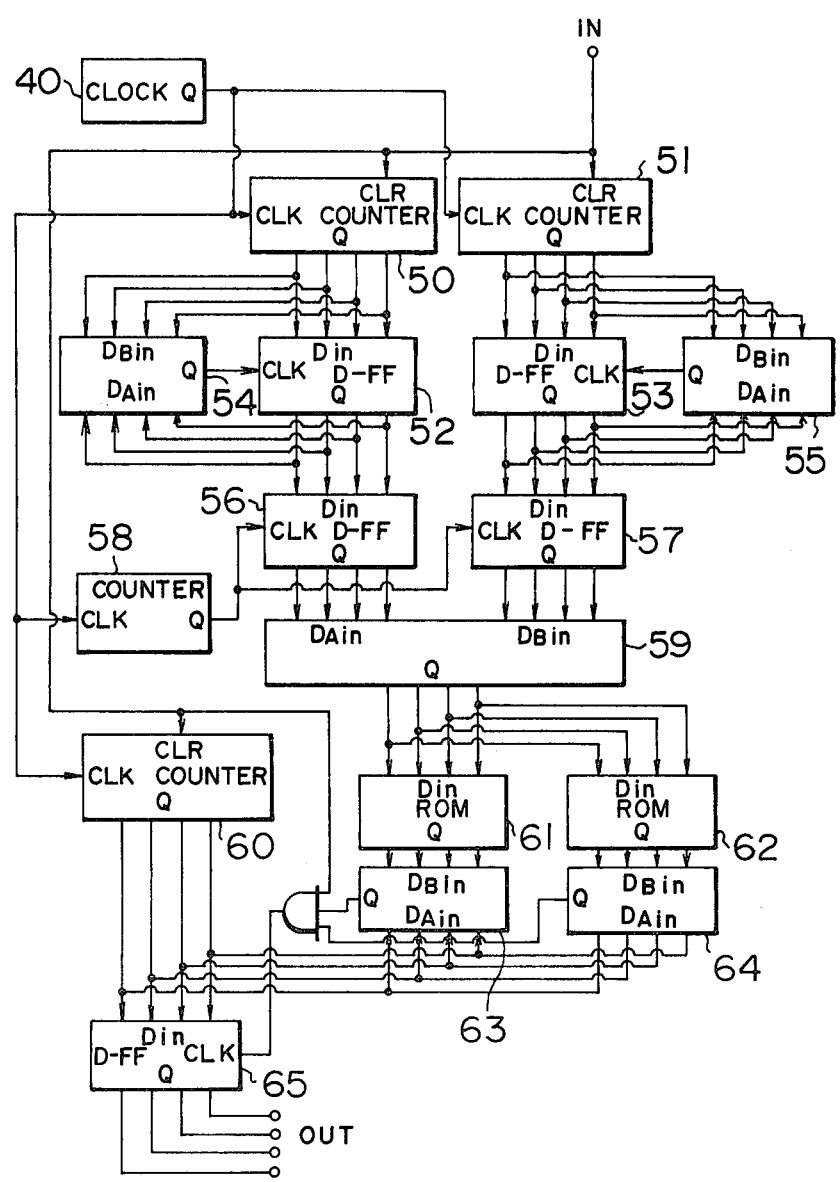
FIG. 9 shows a circuit diagram of another embodiment of the present invention.

FIG. 9 shows other embodiment of the present invention. Like numerals to those shown in FIGS. 5 and 8 denote like elements. Numeral 60 denotes a counter, numeral 65 denotes a D-type flip-flop, numerals 61 and 62 denote read-only memories (ROM) and numerals 63 and 64 denote digital comparators. The MFM signal includes three different pulse widths, 1.0T, 1.5T and 2.0T. In the previous embodiments, the pulse width 1.0T or 2.0T is considered to control the pulse width. In the present embodiment, the pulse width 1.5T of the MFM signal is considered to control the pulse width.

The operation of the circuit of FIG. 9 is now explained. The signal flow up to the D-type flip-flops 56 and 57 for detecting and latching the maximum and minimum widths is identical to that in the embodiment of FIG. 8. The output of the adder 59 is supplied to the ROM's 61 and 62 and the digital comparators 63 and 64 are set by the outputs of the ROM's. The counter 60 counts up the distance between the signal transition points of the MFM signal. If the distance is between the upper limit and the lower limit set in the ROM's 61 and 62, the content of the counter 60 is latched to the D-type flip-flop 65. The D-type flip-flop 56 latches a value proportional to the maximum pulse width, the D-type flip-flop 57 latches a value proportional to the minimum pulse width and the D-type flip-flop 65 latches a value proportional to an intermediate pulse width. Errors from the reference voltages proportional to the respective pulse widths are detected. If one of the latches malfunctions by the disturbance, the two remaining latches produce correct error voltages. Accordingly, the present embodiment is less affected by the disturbance.

Figure 10:
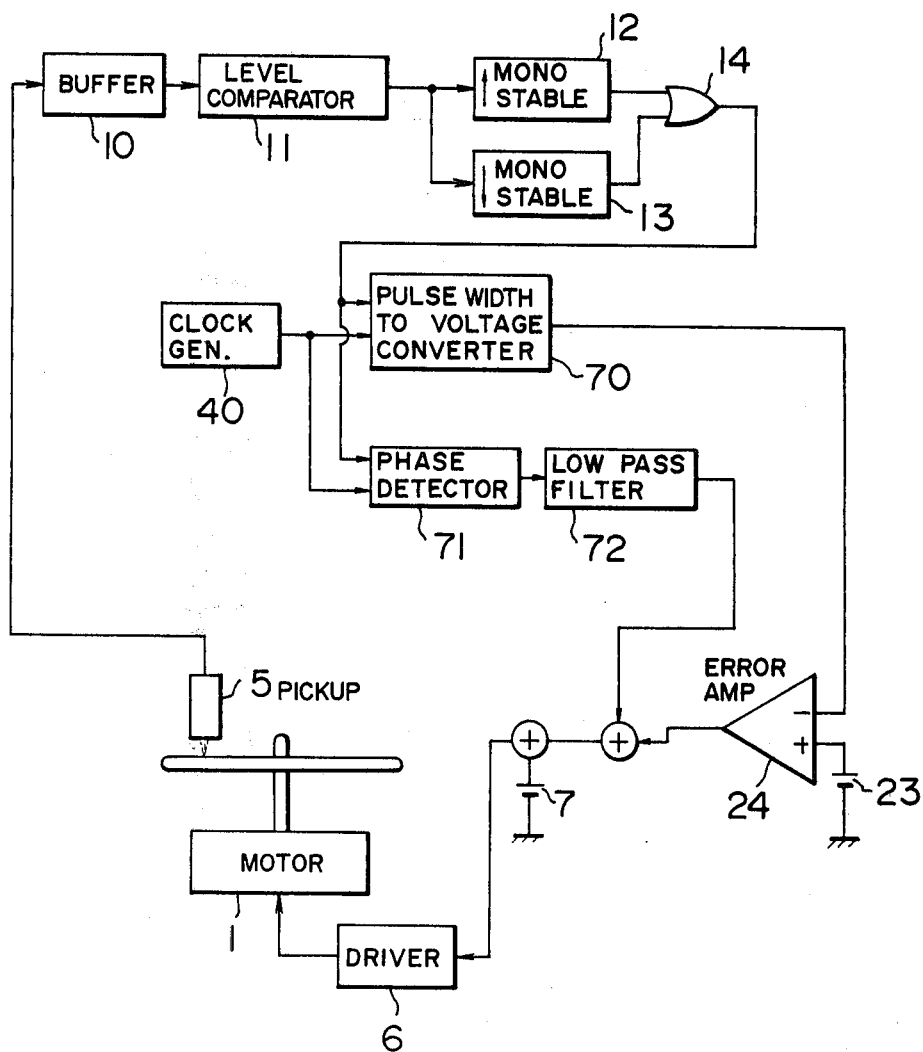
FIG. 10 shows a circuit diagram of another embodiment of the present invention.

FIG. 10 shows an embodiment of the present invention having a phase-controlled servo system. Like numerals to those shown in FIG. 2 denote like elements. Numeral 70 denotes a pulse width-to-voltage converter which includes the circuits between the input of the OR gate 14 and the output of the D/A converter 49 shown in FIG. 5. Numeral 71 denotes a phase detector and numeral 72 denotes a low-pass filter (LPF). The pulse width-to-voltage converter 70 produces a voltage corresponding to a selected one of the pulse widths of the MFM signal. The clock frequency of the clock generator 40 is selected to be an integer times as large as the clock frequency of the MFM signal.

The operation of the circuit of FIG. 10 is now explained. The MFM signal reproduced by the pickup 5 is converted to a voltage by the pulse width-to-voltage converter 70, and an error from the reference voltage 23 is detected by the error amplifier 24 and the rotation speed of the motor 1 is controlled by the drive circuit 6. When the rotation speed of the motor 1 approaches a target speed, the phase detector 71 which compares the phases of the signal transition of the MFM signal and the signal of the clock generator 40 generates a beat due to a difference between the frequencies. This beat passes through the LPF 72 and added to the motor drive signal. As a result, the rotation speed of the motor is controlled such that the clock frequency of the clock generator is an integer times as large as the clock frequency of the MFM signal. When the rotation speed of the motor 1 largely deviates from the target speed, the beat generated by the phase detector 71 is attenuated by the LPF. Accordingly, the loop including the phase detector 71 and the LPF 72 is not actuated until the rotation speed of the motor 1 approaches the target speed.

Figure 11:
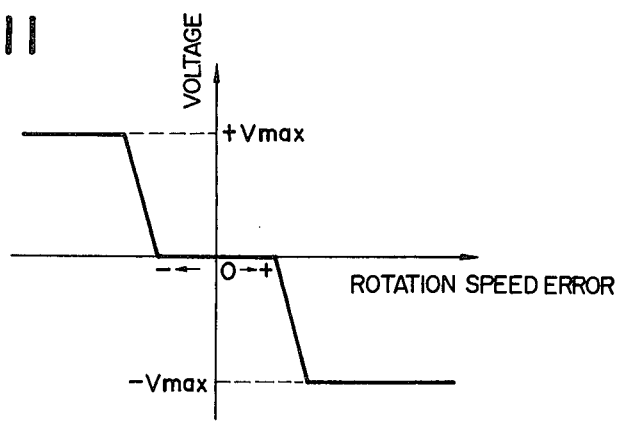
FIG. 11 shows a control characteristic of a control circuit in accordance with the present invention.
Figure 12:
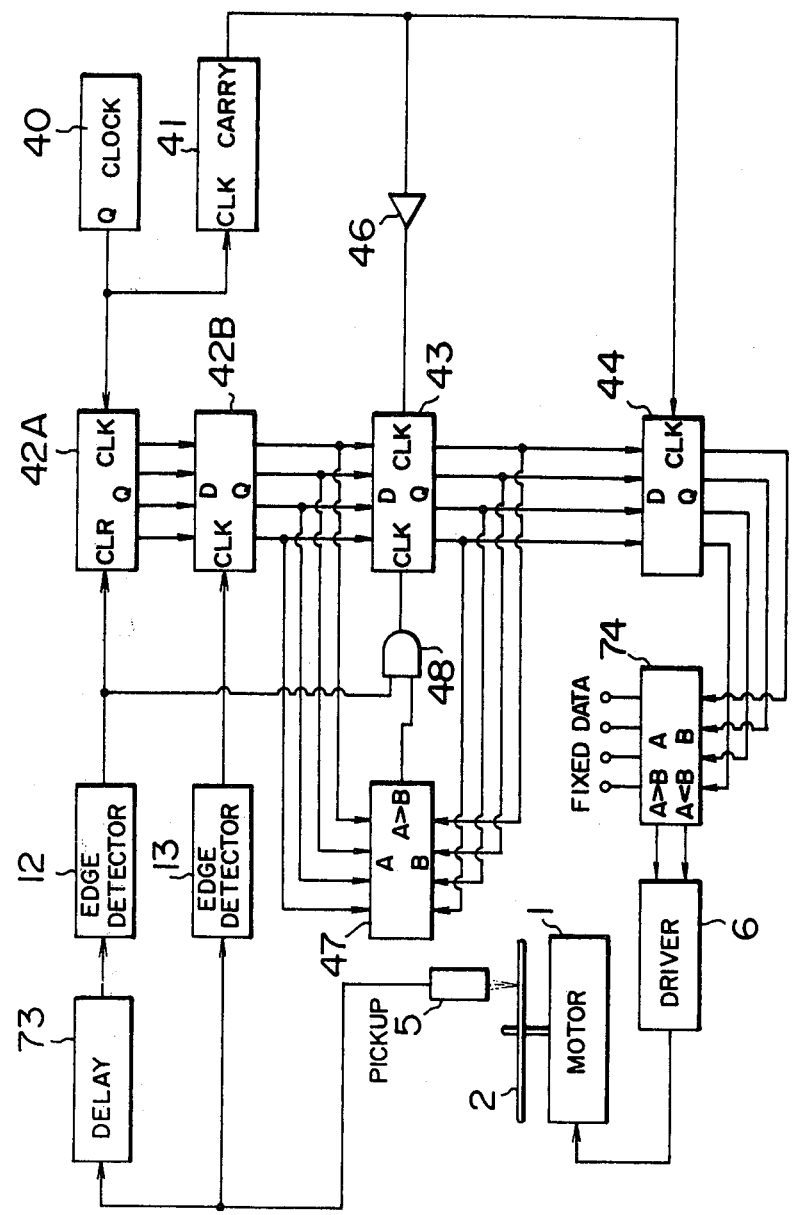
FIG. 12 shows a circuit diagram of one embodiment of the control circuit of the present invention.

FIG. 12 shows other embodiment of the present invention. In the present embodiment, a pulse width of an input signal is defined to attain an input-output characteristic shown in FIG. 11. In FIG. 12, numeral 73 denotes a delay circuit.

Figure 13:
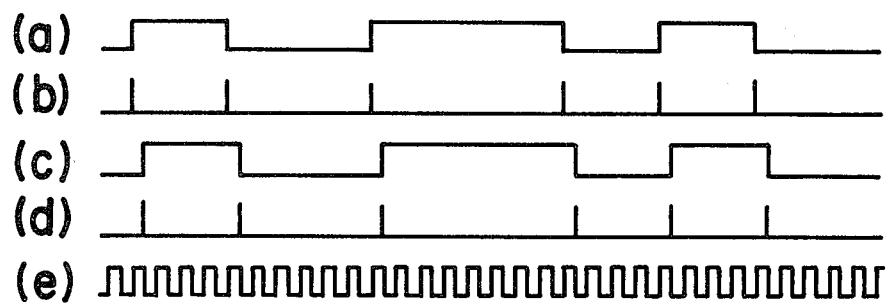
FIG. 13, consisting of a-e, shows a timing chart for explaining the circuit operation of FIG. 12.

The MFM signal (FIG. 13(a)) reproduced by the pickup 5 from the disc 2 driven by the motor 1 is supplied to an edge detector 13 and the delay circuit 73. The edge detector 13 produces an edge pulse at a signal transition point of the input MFM signal as shown in FIG. 13(b). This edge pulse is supplied to a D-type flip-flop 42B. The delay circuit 73 delays the input MFM signal by one half of the period of the clock (FIG. 13(e)) of the clock generator 40, as shown in FIG. 13(c), and the delayed output signal is supplied to an edge detector 12. An edge pulse (FIG. 13(d)) from the edge counter 12 is supplied to a clear terminal of a counter 42A and an AND gate 48. The counter 42A is cleared by the edge pulse shown in FIG. 13(d) and counts up the clocks from the clock generator 40. The Q-output of the counter 42A is latched to the D-type flip-flop 42B at the edge pulse shown in FIG. 13(b). Accordingly, the number of clocks between the edge pulse shown in FIG. 13(d) and the edge pulse shown in FIG. 13(b) is latched to the D-type flip-flop 42B. Since the edge pulse (d) is delayed relative to the edge pulse (b) by one half clock period, the content of the D-type flip-flop 42B indicates the number of clocks in the edge-to-edge distance of the input MFM signal (FIG. 13(a)) less one half of the clock period. If 8.5 clocks exist between the edges of the MFM signal pattern, the content of the D-type flip-flop 42B is "8", and if eight clocks exist, the content is "7" or "8". Thus, the D-type flip-flop 42B latches the count of the clocks counted in the period between the edges of the MFM signal less one half of the clock period. In this manner, by defining the pulse width of the input signal, the input-output characteristic is offset and a characteristic having non-sensitive bands distributed around a zero-error line is attained as shown in FIG. 11.

The subsequent operation is identical to that of the embodiment of FIG. 5. Only when the content of the D-type flip-flop 42B is larger than the content of the D-type flip-flop 43 as detected by the digital comparator 47, the pulse is applied to the clock terminal of the D-type flip-flop 43 from the AND gate so that the content of the D-type flip-flop 42B is latched. A carry output derived by frequency-dividing the clock of the clock generator 40 by the counter 41 is supplied to the clear terminal of the D-type flip-flop 43 through the buffer 46. The content of the D-type flip-flop 43 immediately before it is cleared indicates the maximum number of clocks in the pulse width of the MFM signal less one half of the clock period, after it has been previously cleared. Immediately before the D-type flip-flop 43 is cleared, a latch lock signal is supplied to the D-type flip-flop 44 so that the maximum value in the D-type flip-flop 43 is latched. The output of the D-type flip-flop 44 is supplied to the B-input of a digital comparator 74, and the number of clocks in the 2T pattern of the MFM signal when the rotation speed of the motor 1 is correct is supplied to the A-input of the digital comparator 74 as a fixed data. The A>B output and the A<B output of the digital comparator 74 are supplied to the motor drive circuit 2, which produces a voltage to decelerate the motor 1 when the A>B output is supplied from the digital comparator 74, and produces a voltage to accelerate the motor 1 when the A<B output is supplied.

That is, if the rotation speed of the motor 1 is high and the content of the D-type flip-flop 44 is smaller than the fixed data, the deceleration voltage is applied to the motor 1, and if the rotation speed is low and the content of the D-type flip-flop 44 is larger than the fixed data, the acceleration voltage is applied to the motor 1 to correct the rotation speed of the motor 1.

By including at least one 2T pattern of the MFM signal in the period of the carry output from the counter 41 as is done in the embodiment of FIG. 5, the content of the D-type flip-flop 44 always indicates the number of clocks from the clock generator 40 counted by the counter 42A in the period from the leading edge of the 2T pattern of the MFM signal which is the longest pattern to a point one half clock period before the trailing edge.

The Q-output of the D-type flip-flop 44 is compared with the fixed data by the digital comparator 49. The output voltage of the motor drive circuit 6 or the drive voltage of the motor 1 which is controlled by the A>B output and the A<B output of the digital comparator 49 exhibits a characteristic having non-sensitive bands distributed on opposite sides of a zero-error line as shown in FIG. 11, in which $N_o$ is the number of clocks included in the 2T pattern of the MFM signal when the rotation speed of the motor 1 is correct, and "$N_o$" is the fixed data input.

Figure 15:
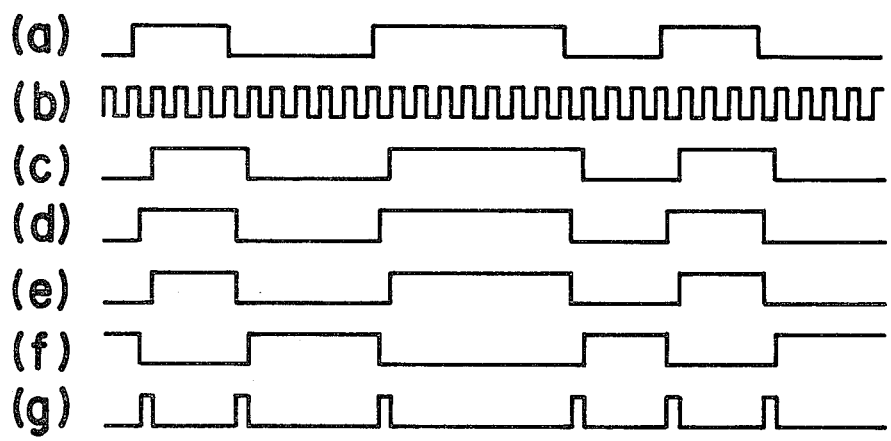
FIG. 15, consisting of a-g, shows a timing chart for explaining the circuit operation of FIG. 14.
Figure 14:
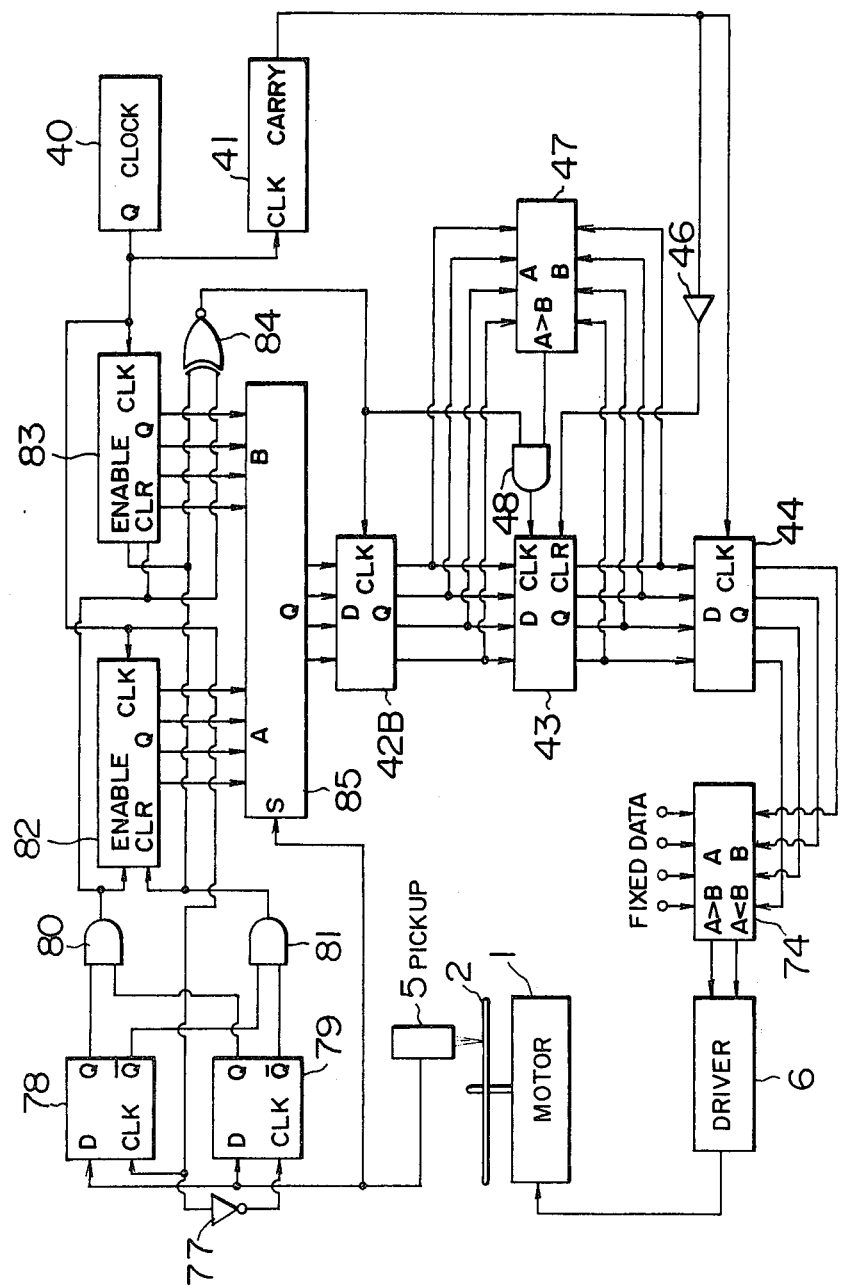
FIG. 14 shows a circuit diagram of another embodiment of the control circuit of the present invention.

FIG. 14 shows another embodiment of the control circuit of the present invention, and FIG. 15 shows a time chart therefor. In FIG. 14, like numerals to those shown in FIG. 5 denote like elements. Numeral 77 denotes an inverter, numerals 78 and 79 denote D-type flip-flops, numerals 80 and 81 denote AND gates, numerals 82 and 83 denote counters, numeral 84 denotes an exclusive NOR gate and numeral 85 denotes a multiplexer.

In FIG. 14, the MFM signal shown in FIG. 15(a) and reproduced by the pickup 5 from the disc 2 driven by the motor 1 is supplied to data terminals of the D-type flip-flops 78 and 79. The clock from the clock generator 40 having the phase shown in FIG. 15(b) is supplied to the clock terminal of the D-type flip-flop 78, and the input at the data terminal is read at the edge of the clock. Thus the Q-output of the D-type flip-flop 78 produces a signal shown in FIG. 15(c). The clock from the clock generator 40 is also applied to the clock terminal of the D-type flip-flop 79 through the inverter 77 so that it is applied in opposite phase to the phase of FIG. 15(b). Thus, the Q-output of the D-type flip-flop 79 produces a signal shown in FIG. 15(d). The Q-outputs of the D-type flip-flops 78 and 79 are supplied to the AND gate 80, and the output of the AND gate 80 shown in FIG. 15(e) is supplied to an enable terminal of the counter 82. The Q-outputs of the D-type flip-flops 78 and 79 are supplied to the AND gate 81, and the output of the AND gate 81 shown in FIG. 15(f) is supplied to a clear terminal of the counter 82. Only when the enable input to the counter 82 is HIGH, the counter 82 counts up the clocks supplied to the clock terminal from the clock generator 40 and the counter 82 is cleared when the input to the clear terminal is HIGH. Accordingly, the counter 82 is cleared when the clear input shown in FIG. 15(f) is HIGH and counts up the number of clocks during the HIGH enable input period shown in FIG. 15(e). The HIGH signal period of FIG. 15(e) corresponds to the HIGH period of the input MFM signal and its length is equal to the length of the HIGH period of the MFM signal less one half of the clock period. The Q-output of the counter 82 is supplied to the A-terminal of the multiplexor 85.

The output of the AND gate 81 shown in FIG. 15(f) is supplied to the enable terminal of the counter 83 and the output of the AND gate 80 shown in FIG. 15(e) is supplied to the clear terminal. The counter 83 counts up the clocks applied to the clock terminal from the clock generator 40 only when the enable input is HIGH and cleared when the clear input is HIGH. Accordingly, the counter 83 is cleared when the input at the clear terminal shown in FIG. 15(e) is HIGH and counts up the clocks during the HIGH period of the enable input shown in FIG. 15(f). The HIGH period of the signal shown in FIG. 15(f) corresponds to the LOW period of the input MFM signal and its length is equal to the length of the LOW period of the MFM signal less one half of the clock period. The Q-output of the counter 83 is supplied to the B-terminal of the multiplexor 85.

The multiplexor 85 receives the input MFM signal at its switching terminal and produces, at its Q-terminal, the Q-output of the counter 83 connected to the B-terminal when the MFM signal (FIG. 15(a)) is HIGH and the Q-output of the counter 82 connected to the A-terminal when the MFM signal is LOW. The Q-output of the multiplexor 85 is supplied to the data terminal of the D-type flip-flop 42B, and the output of the exclusive NOR gate 84 (FIG. 15(g)) to which the output of the AND gates 80 and 81 are applied is supplied to the clock terminal of the D-type flip-flop 42B. The D-type flip-flop 42B latches the input at the data terminal at the leading edge of the signal shown in FIG. 15(g). Accordingly, the number of clocks of the counter 82 in the HIGH period of the signal shown in FIG. 15(e) and the number of clocks of the counter 83 in the HIGH period of the signal shown in FIG. 15(f) are alternately latched to the D-type flip-flop 42B.

Since the count clock period of the counters 82 and 83 is one half of the clock period shorter than the HIGH of LOW period of the MFM signal as described above, the content of the D-type flip-flop 42B indicates the number of clocks in the edge-to-edge period of the input MFM signal less one half of the count clock period.

The subsequent operation is similar to that of the embodiment shown in FIG. 12, and the present embodiment attains a similar characteristic.

As described hereinabove, according to the present invention, the accurate CLV control is attained without detecting the position of the pickup and the control circuit operates in a stable manner even when the phase control is simultaneously used.

In the embodiments described above, the digital data signal is assumed as the MFM signal for the convenience of description. In the DAD reproducing system, when the MFM system is used, a D.C. component is produced, so that zero slicing may cause an error in the detection of signal transition. Hence it should be suppressed. To this end, code modulation systems in which a reduced D.C. component is produced may be used. One example thereof is a well-known eight-to-fourteen modulation (EFM) system in which nine different intervals between the signal transitions, 3T–11T are included.

We claim:

1. A control apparatus for a recording medium drive motor in a digital information reproducing apparatus comprising:

(a) pickup means for reproducing a digital signal from said recording medium having a digital information recorded thereon in the form of a signal sequence modulated with a predetermined plural number of pulse widths;

(b) transition point detection means for detecting rising edges and falling edges of the reproduced digital signal to detect signal transition points;

(c) counter means responsive to the output from said transition point detection means for counting a length of an input pulse width;

(d) first latch means for reading in the content of said counter means and holdng a count corresponding to a maximum pulse width of the input pulse widths;

(e) compare means for comparing input value and output value of said first latch means and loading the content of said counter means to said first latch means when the input value from said counter means is larger than the output value of said first latch means;

(f) second latch means adapted to receive the content of said first latch means and holding a maximum count of the counts in said counter means in a predetermined period;

(g) clock rate error signal generating means for comparing the output of said second latch means with a reference value corresponding to a predetermined maximum pulse width to produce an error signal for the clock rate; and (h) drive means responsive to the output of said clock rate error signal generating means for producing a drive output to drive said recording medium drive motor.

2. A control apparatus for a drive motor of a recording medium in a digital information reproducing apparatus comprising:

pulse width detection means for detecting in a given period one of a maximum and minimum pulse width in a digital data signal derived from said recording medium and providing an output indicative thereof, the digital data being in the form of a signal sequence modulated with a predetermined plural number of predetermined pulse widths;

reference signal source means for producing a reference signal corresponding to one of a predetermined maximum and minimum pulse width;

error signal generating means for receiving the outputs of said pulse width detection means and said reference signal source means and for comparing said detected pulse width with said reference signal and for producing an error signal in accordance with the comparison; and drive means responsive to the output of said error signal generating means for producing a drive output for driving said recording medium drive motor and for controlling the rotation speed of the motor.

3. The control apparatus according to claim 2, wherein said pulse width detection means includes pickup means for deriving digital data signal from said recording medium, and a pulse width-to-voltage conversion means for converting the pulse width of the digital data signal derived by said pickup means into a voltage proportional thereto, said reference signal source means producing a fixed voltage corresponding to the one of the predetermined maximum and minimum pulse width as the reference signal.

4. The control apparatus according to claim 2, wherein said pulse width detection means includes edge detector means for receiving said digital signal as an input thereof and for detecting edges of the pulse waveform and providing an output indicative thereof, sawtooth wave generator means for being triggered by the output of said edge detector means and generating a sawtooth wave output, and peak holding circuit means for holding a peak value of the output of said sawtooth wave generator means.

5. The control apparatus according to claim 2, wherein said pulse width detection means includes edge detector means receiving a digital signal derived from said recording medium in the form of a pulse waveform and for detecting the rising edge and the falling edge of the pulse waveform and providing an output indicative thereof, clock generator means for generating a clock output, and counter means receiving the outputs of said clock generator means and said edge detector means and for counting the pulse width of the received digital signal.

6. The control apparatus according to claim 5, wherein said pulse width detection means further includes setting means for setting a clock count period to be shorter than an interval between edges of the pulse width of said digital signal.

7. The control apparatus according to claim 6, wherein said setting means sets the clock count period to be equal to the interval between edges of said digital signal less one half of a clock period.

8. The control apparatus according to claim 5, wherein said pulse width detection means further includes first latch circuit means for latching the content of said counter means, reset circuit means for resetting said counter means at each edge of said digital signal, and second latch circuit means for latching a predetermined pulse width in the output of said first latch circuit means at a constant cycle.

9. The control apparatus according to claim 2, wherein said pulse width detection means detects a maximum pulse width.

10. The control apparatus according to claim 2, wherein said pulse width detecting means detects a minimum pulse width.

11. The control apparatus according to claim 2, wherein said recording medium is a digital audio disc.

12. The control apparatus according to claim 2, wherein said drive means produces a drive output for increasing and decreasing the rotation speed of the motor in accordance with the error signal.

* * * * *